US011419249B1

(12) United States Patent
Shawl (10) Patent No.: US 11,419,249 B1
(45) Date of Patent: Aug. 16, 2022

(54) ERGONOMIC RF-EMF SHIELDING KIT FOR LAPTOPS AND DESKTOPS

(71) Applicant: Theodros Shawl, Oakland, CA (US)

(72) Inventor: Theodros Shawl, Oakland, CA (US)

(*) Notice: Subject to any disclaimer, the term of this patent is extended or adjusted under 35 U.S.C. 154(b) by 0 days.

(21) Appl. No.: 17/194,196

(22) Filed: Mar. 5, 2021

(51) Int. Cl.
*G06F 1/16* (2006.01)
*H05K 9/00* (2006.01)

(52) U.S. Cl.
CPC ......... *H05K 9/0081* (2013.01); *G06F 1/1656* (2013.01); *G06F 1/1664* (2013.01)

(58) Field of Classification Search
CPC .... H05K 9/0081; G06F 1/1656; G06F 1/1664
See application file for complete search history.

(56) References Cited

U.S. PATENT DOCUMENTS

| | | | |
|---|---|---|---|
| 5,183,230 A | 2/1993 | Walker et al. | |
| 5,355,811 A * | 10/1994 | Brewer | A47B 23/002 108/43 |
| 5,779,211 A * | 7/1998 | Bird | A47B 23/002 224/222 |
| 5,937,765 A * | 8/1999 | Stirling | A47B 23/002 108/43 |
| 6,116,418 A * | 9/2000 | Sadow | G06F 1/1628 190/110 |
| 6,237,879 B1 * | 5/2001 | Budge | G06F 1/1616 248/118 |
| 6,385,037 B2 * | 5/2002 | Howell | G06F 1/1616 361/679.55 |
| 6,648,282 B1 * | 11/2003 | Sykes | G06F 3/0395 248/444 |
| 6,887,005 B2 * | 5/2005 | Kim | A47B 21/0371 361/679.19 |
| 7,121,214 B1 * | 10/2006 | Toltzman | A47B 23/002 108/50.01 |
| 7,207,539 B1 * | 4/2007 | Jacobs | G06F 3/0395 248/118.1 |
| 7,545,634 B2 | 6/2009 | Simonian et al. | |
| 7,861,984 B2 * | 1/2011 | Quiroga | G06F 3/039 248/118.1 |
| 8,479,915 B2 * | 7/2013 | Chen | G06F 1/1626 206/472 |

(Continued)

FOREIGN PATENT DOCUMENTS

| | | | |
|---|---|---|---|
| AT | 503566 B1 | * | 11/2007 |
| CN | 104260487 A | * | 1/2015 |
| CN | 109435349 A | * | 3/2019 |

*Primary Examiner* — Abhishek M Rathod
*Assistant Examiner* — Keith DePew (57) ABSTRACT

The present invention provides a kit for laptop and PC users with assemblage components that fit upon a mouse pad, and are designed to mitigate the effects of carpal tunnel syndrome (CTS) and provide radio frequency or EMF shielding. The kit includes a pair of removable triangular wrist pads that fit onto the corners of a laptop. The wrist pads comprise an upper portion with an arcuate shape and stiffness to reduce CTS; and are detachable from the base triangles for affixing directly to the laptop beneath the typing keys. A pair of thigh pads having a relatively flat top side are designed for positioning on a user's lap to provide EMF shielding and raise the laptop for easier viewing. A third hollow wrist pad for use with a mouse pad has internal storage. Both the mouse pad underside and the assemblage components underside comprise fixation strips for secure storage.

16 Claims, 10 Drawing Sheets

(56) References Cited

U.S. PATENT DOCUMENTS

| | | | | |
|---|---|---|---|---|
| 8,493,732 B2* | 7/2013 | Lineal | G06F 1/203 | 361/679.48 |
| 8,777,174 B2* | 7/2014 | Hynell | G06F 1/1628 | 361/679.55 |
| 9,095,194 B2* | 8/2015 | Hassett | G06F 1/1626 | |
| 9,289,059 B2* | 3/2016 | Lineal | A47B 23/04 | |
| 10,028,601 B2* | 7/2018 | Lo | A47G 9/1045 | |
| 10,393,157 B2* | 8/2019 | Schneider | G06F 3/0393 | |
| 2001/0000109 A1* | 4/2001 | Kim | A47B 21/0371 | 248/118.1 |
| 2005/0098689 A1* | 5/2005 | Sykes | G06F 3/0395 | 248/118 |
| 2006/0274045 A1* | 12/2006 | Stenbroten | G06F 3/0219 | 345/168 |
| 2007/0069096 A1* | 3/2007 | VonHeck | G06F 3/03543 | 248/346.01 |
| 2007/0084976 A1* | 4/2007 | Bate | G06F 3/0395 | 248/118 |
| 2008/0001042 A1* | 1/2008 | Quiroga | G06F 3/039 | 248/118 |
| 2008/0061207 A1* | 3/2008 | Panziera | A47B 23/002 | 248/346.01 |
| 2008/0142672 A1* | 6/2008 | Tran | G06F 1/1656 | 248/560 |
| 2008/0310094 A1* | 12/2008 | Burns | G06F 1/1616 | 361/679.01 |
| 2009/0056596 A1* | 3/2009 | Stemmer | A47B 97/00 | 108/50.01 |
| 2009/0068910 A1* | 3/2009 | Fredrick | B29C 66/729 | 53/430 |
| 2010/0073870 A1* | 3/2010 | Diez Munoz | G06F 1/1656 | 361/679.55 |
| 2010/0110629 A1* | 5/2010 | Dietz | A45C 11/00 | 361/679.55 |
| 2010/0183814 A1* | 7/2010 | Rios | A43B 13/04 | 427/387 |
| 2010/0226085 A1* | 9/2010 | Zuckerman | G06F 3/039 | 361/679.19 |
| 2010/0230556 A1* | 9/2010 | Mayer | G06F 1/1656 | 248/118 |
| 2011/0309212 A1* | 12/2011 | Guerrieri | H05B 3/347 | 248/118 |
| 2011/0309222 A1* | 12/2011 | Hynell | G06F 1/1628 | 248/346.02 |
| 2012/0043234 A1* | 2/2012 | Westrup | A45C 3/02 | 206/320 |
| 2012/0060724 A1 | 3/2012 | Doss et al. | | |
| 2014/0111363 A1* | 4/2014 | Alberth, Jr. | H01Q 1/245 | 342/1 |
| 2018/0271176 A1* | 9/2018 | Harrell | B32B 7/12 | |
| 2020/0128953 A1* | 4/2020 | Goldhammer | A47B 23/06 | |

* cited by examiner

ERGONOMIC RF-EMF SHIELDING KIT FOR LAPTOPS AND DESKTOPS

FIELD OF THE INVENTION

The present invention generally relates to accessories for laptops and other computing devices. More specifically, the present invention relates to an ergonomic and Radiofrequency-Electromagnetic Frequency (RF-EMF) shielding kit or assemblage for use with desktops, laptops, tablets, or other similarly sized electronic devices.

BACKGROUND OF THE INVENTION

Personal computers (PCs) have been in use for many years now, and the general population has come to rely on them in order to perform many basic functions such as shopping, record keeping, and video entertainment. Even with the rise in use of smaller computing devices such as smartphones, smartwatches, and tablets, laptops are still in use because of several factors such as screen size, speed, memory capacity, and computing power.

While the laptop provides superior utility for certain applications and uses, it suffers from two major drawbacks in terms of user comfort and safety. First, as with all computing devices having a keyboard, carpal tunnel syndrome (CTS) and other repetitive stress injuries can occur. This is primarily due to the fact that a laptop must be relatively flat, which makes the use of ergonomic keyboards virtually impossible. CTS is caused by cumulative damage to the finger tendons as they pass through a short, narrow, rigid channel in the wrist, the carpal tunnel. With the hand-oriented palm down, the roof of the carpal tunnel is formed by the arch of the carpal bones and the floor by the tough transverse carpal ligament. The carpal tunnel contains the tendons for the fingers, the radial artery, and the median nerve, which transmits sensation for the thumb and the first two and half fingers. Sensation for the remaining digits is transmitted via the ulnar nerve, which runs outside of the carpal tunnel.

As the hand deviates from normal either horizontally towards the thumb or towards the little finger (ulnar deviation), or vertically up or down, then the pressure on the carpal tunnel increases. Vertical deviations especially create significant increases in carpal tunnel pressure. Accelerations from extension to flexion are thought to pose the greatest risk for CTS, and when the hand is in a wrist neutral position, then there is minimum pressure on the tendons and the median nerve in the carpal tunnel. With occupational overuse of the fingers, minor trauma to the tendons and the sheaths may accumulate and eventually produce CTS.

As the tendons or their sheaths become irritated and inflamed, the resulting swelling increases the pressure on the median nerve, which initially causes tingling, then numbness over time. Eventually disabling pain results when the fingers are moved. Laptop users are particularly at risk because of the large number of finger movements made in a short time, and the fact that the keyboard is flat, which results in very unnatural positioning of the hands.

The second problem with laptop use is the fact that the entire device is in close proximity to the user, in contrast to a desktop where only the keyboard need be close to the user. When considering that the laptop includes a large screen, a power source, and an RF transmitter, a great deal of EMF or RF radiation is emitted from the device.

Accordingly, it is desirable to provide a means to reduce CTS while providing RF shielding for laptop users.

SUMMARY OF THE INVENTION

The present invention provides a kit for laptop and PC users. The kit is an all-in-one assemblage of various components designed to mitigate the effects of carpal tunnel syndrome (CTS) and provide radio frequency or EMF shielding. The kit includes a pair of removable palm rest or wrist pads, which are ergonomically shaped and adjustably attachable to a laptop. A pair of thigh pads having a relatively flat top side are designed for positioning on a user's lap. The thigh pads provide EMF shielding and also raise the laptop closer to the user's eyes. A wrist pad for use with a mouse pad is also included. The mouse pad completes the kit and also serves as a base upon which the other components may be assembled for storage.

In an embodiment, the present invention comprises an assemblage of components for providing improved ergonomic positioning and RF shielding for a laptop and a desktop computer users, comprising: (a) a first and a second wrist pad, said wrist pads configured for removable attachment to left and right corners of a laptop, said wrist pads having a main body lower portion formed of RF shielding material, with an upper portion having an arcuate shape and positioned to accommodate pivoting of a user's hand; and, (b) a pair of lap cushions formed of RF shielding material.

In an embodiment, the assemblage upper portion of the first and second wrist pads is attached to said lower portion by an elasticated connector, which may further comprise a friction material on an exterior surface able to reduce slippage of the first and second wrist pads relative to the laptop regardless of the dimensions of the laptop. And the elasticated connectors may be removeable from the lower portion and affixable to a laptop surface in a proper alignment with a plurality of typing keys.

In an embodiment, the main body lower portion of the first and second wrist pads has a triangular shape corresponding to corners of the laptop; and the main body lower portion has a thickness of about 1.0 mm to about 1.5 mm.

In an embodiment, the assemblage further comprises a mouse pad upon which said assemblage components fit. And an underside of said mouse pad has a plurality of fastening material on one side to affix said assemblage components for storage. The assemblage may further comprise a third wrist pad substantially rectangular shaped for positioning on said mouse pad; and the third wrist pad comprises an interior cavity as storage space with a closure. And the assemblage components are geometrically shaped for positioning on said mouse pad in non-overlapping relation with respect to said mouse pad when said assemblage is in a storage mode. Additionally, the assemblage components may comprise fastening material on an underside side for attachment to the mouse pad underside when said assemblage is in the storage mode.

In an embodiment, the lap pads are able to be used as a fourth wrist pad or a forearm pads with a table-top computer.

In an embodiment, the first and second wrist pads upper portion have an arcuate shape and stiffness able to position a user's hand in a proper ulnar, radial nerve positions to prevent and/or alleviate symptoms for carpal tunnel syndrome (CTS). The first and second wrist pads may have a thickness of about 2 mm to about 4 mm for the radial nerve in a user's thumb, forefinger; and about 5 mm to about 8 mm for the ulnar nerve in the user's pinkie finger; and the elasticated portion has a thickness of about 1 mm.

In an embodiment, the first and a second wrist pad are detached from the main bodies; and the wrist pad upper portions are able to attach to a computer keyboard. The upper portion further comprises an extension strip to attach the first and second wrist pad to the side of a computer keyboard. In another embodiment, the wrist pad upper portions comprise an extension strip to attach the first and second wrist pad to the side of a computer keyboard.

It is a major object of the invention to provide an assemblage of components to enhance user comfort and safety when using a laptop or similar electronic devices.

It is another object of the invention to provide an assemblage of components to enhance user comfort and safety when using a laptop which includes components designed to reduce carpal tunnel syndrome.

It is another object of the invention to provide an assemblage of components to enhance user comfort and safety when using a laptop, in which the assemblage provides RF shielding.

It is another object of the invention to provide an assemblage of components to enhance user comfort and safety when using a desktop computer or similar device.

DETAILED DESCRIPTION OF EXEMPLARY EMBODIMENTS

The present invention is directed to a kit or assemblage of components designed to provide enhanced comfort and safety for users of laptops, desktop PCs, and other similarly configured electronic devices which require tactile interaction. While primarily designed for use with laptop computers, the assemblage, generally indicated by the numeral 10, may also be used with desktop computers.

As illustrated in FIGS. 1-10, assemblage 10 comprises the following components: two wrist pads 20, 22; two connected thigh pads 50; a rectangular shaped, wrist pad 40 that is hollow for storing items; and a mouse pad 42 upon which the other components are able to be stored. Assemblage 10 enhances comfort by providing components that provide more ergonomic positioning for the user's hands when using a keyboard or mouse; and shield the user's lower body from EMF radiation when the laptop is positioned on a user's thighs.

Figure 2:
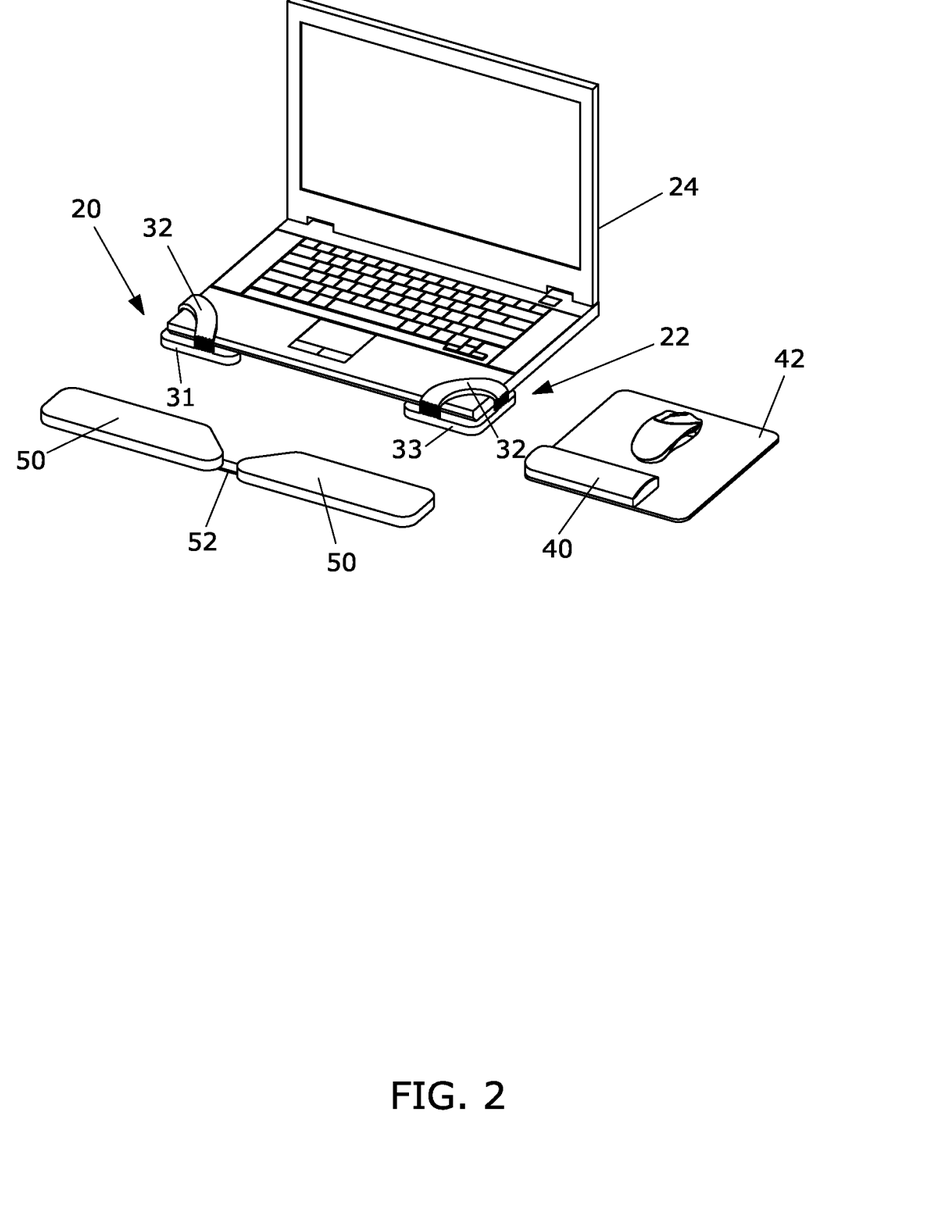
FIG. 2 shows a perspective view of the assemblage of the invention in use with a laptop.
Figure 3:
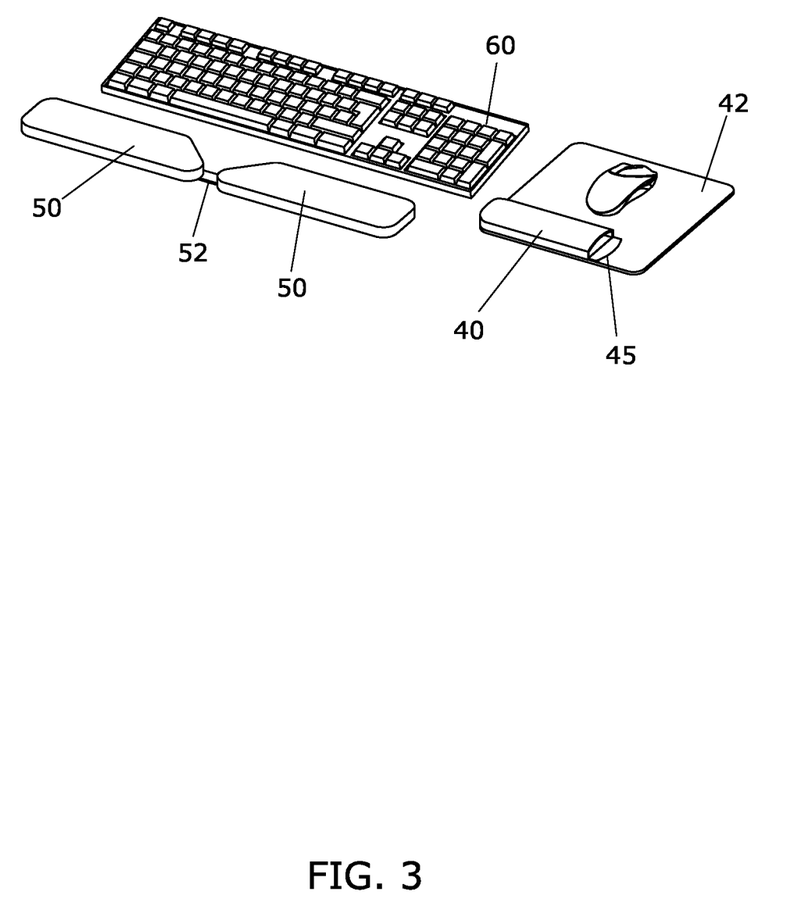
FIG. 3 shows a perspective view of the assemblage of the invention in use with a keyboard of a desktop computer.
Figure 4:
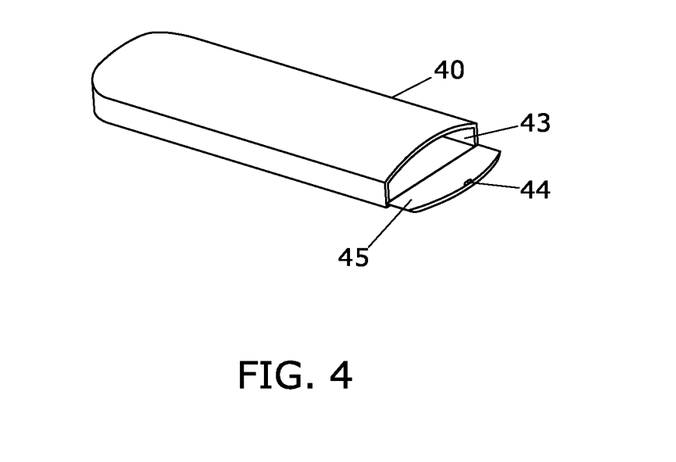
FIG. 4 is a perspective view of the mouse wrist pad with the door open to show the inner storage compartment.
Figure 5:
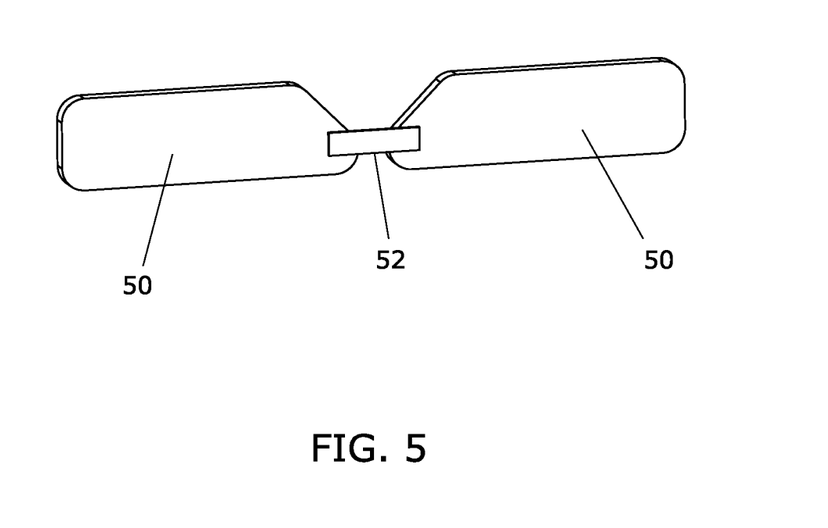
FIG. 5 is a top view of the pair of lap cushions joined by a strap.

In FIG. 2, it can be seen that wrist pads are comprised of left section 20 and right section 22, which are adapted for attachment to respective left and right front corners of a laptop 24. In an embodiment, pads 20, 22 are mirror images and marked as right (R) and left (L). In another embodiment, they are identical and interchangeable.

Figure 6A:
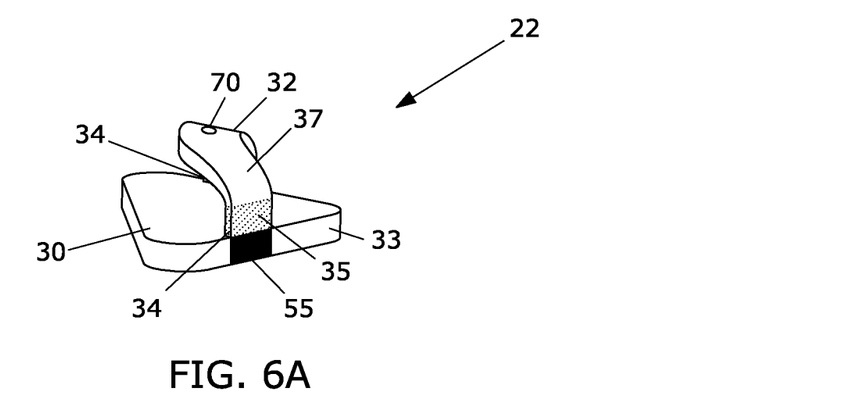
FIG. 6A is a perspective view of the right corner pad.
Figure 6B:
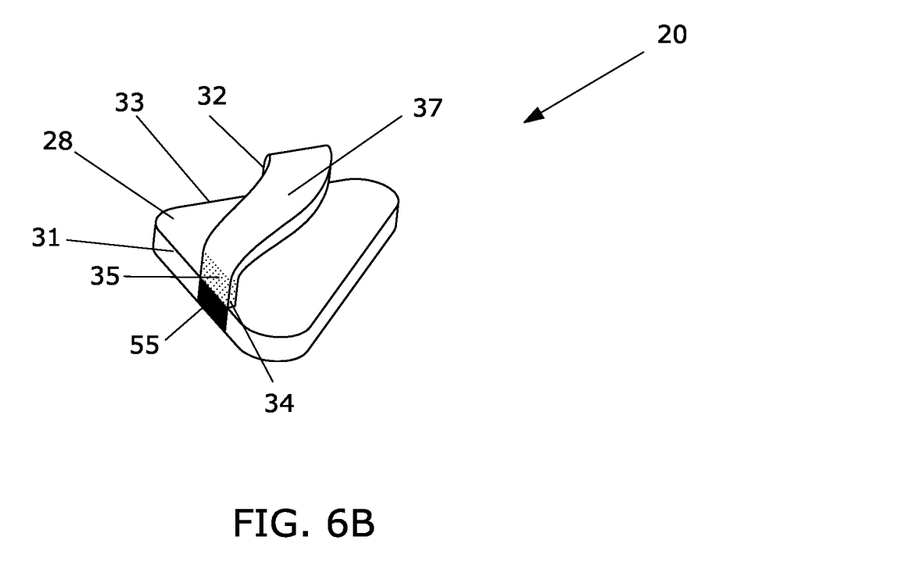
FIG. 6B is a perspective view of the left corner pad.
Figure 7:
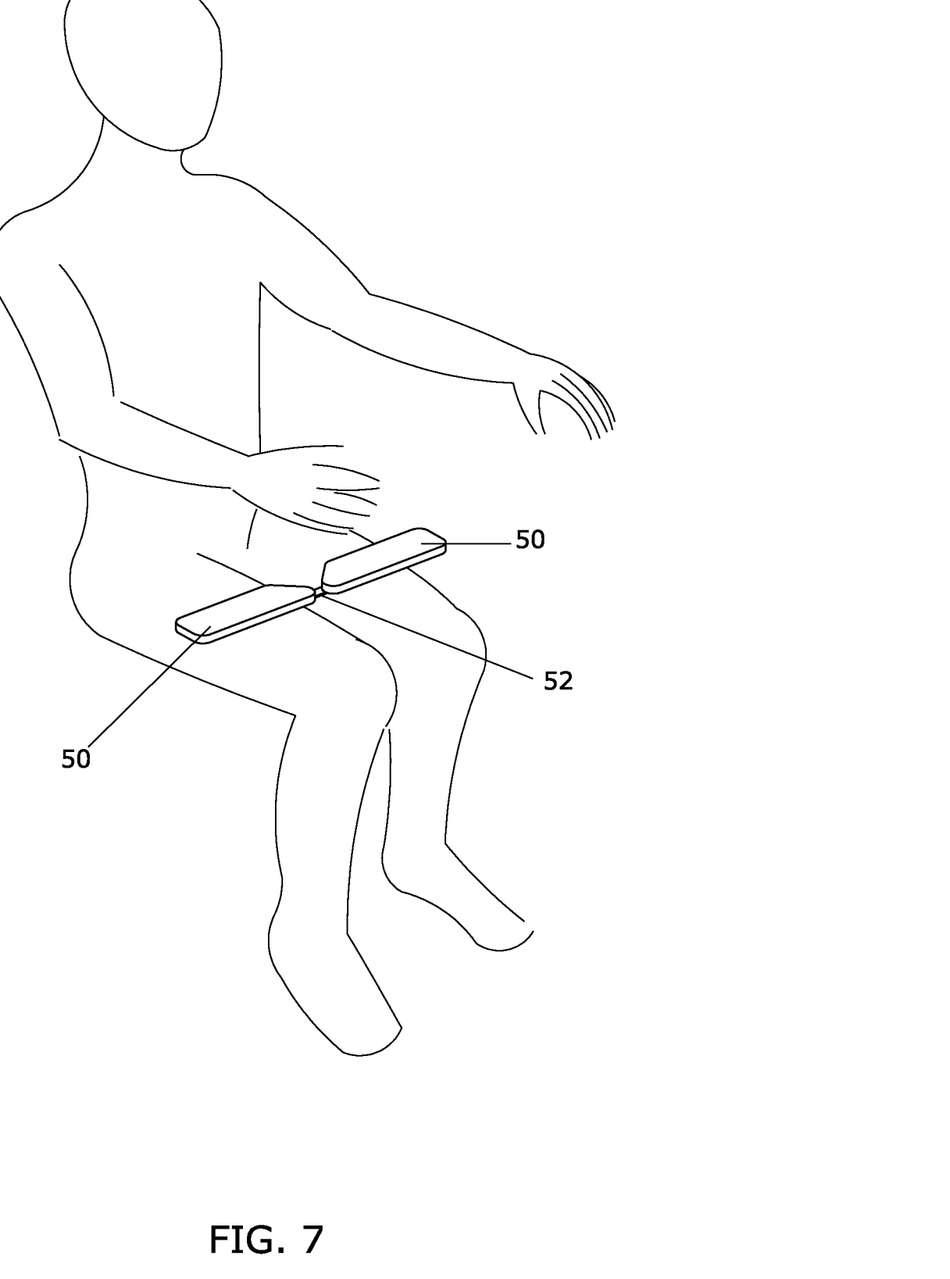
FIG. 7 is an illustration demonstrating the lap cushions positioned on a user's thighs when they are using a laptop on their legs in order to provide radio frequency or EMF shielding to the user's legs.

As illustrated in FIGS. 6A and 6B, the wrist pads 20, 22 have a main body 28, 30 with a substantially triangular shape corresponding to the corner placement of the pads 20, 22. Thus, when positioned on the laptop 24, the edges 31, 33 of main body 28, 30 of wrist pads 20, 22 are flush with the corresponding edges of a laptop 24 having a rectangular configuration as is typically the case. The main body 28, 30 of wrist pads 20, 22 is formed of, or includes, radiation shielding material therein. The materials may be of a non-lead shielding material. Non-lead shielding materials are manufactured with additives and binders mixed with attenuating heavy metals that fall into the same category of materials as lead that also absorb or block radiation. These metals may include tin (Sn), antimony (Sb), tungsten (W) bismuth (Bi) or other elements. Of course, any other suitable materials may be used as would be apparent to one of skill in the art. The main body 28, 30 of wrist pads may alternatively be formed of cloth or synthetic material such as polyester, which encloses radiation shielding material.

The upper padded portion 32 (i.e. the curved straps) of the wrist pads 20, 22 is attached to the main body 28, 30 by an elasticated connector or portion 34, which allows for some variation in the size and thickness of the laptop 24. Elasticated portion 34, in another embodiment, is also removeable, adjustable via a Velcro® strip positioned beneath pad 32. Preferably, the elasticated portion 34 further comprises a non-slip outer surface 35 that provides friction to reduce slippage of the wrist pad 20, 22 relative to the laptop 24 regardless of the dimensions of the laptop allowing different configuration of hand sizes and laptop sizes. Thus, the outer surface 35 helps to keep wrist pads 20, 22 in position on the laptop 24 by providing friction material to reduce the possibility of the wrist pads 20, 22 sliding off of the laptop 24.

The upper portion 32 has a resting surface 37 upon which the user may place their wrists, is configured for the positioning of the heel of the user's wrist, and accordingly has an arcuate or curved shape to allow for pivoting the wrist from side to side without upper portion 32 hindering movement of the hand or fingers. That is, the curved shape of upper portion 32 and resting surface 37 corresponds to the arc that a human wrist or wrist pad would follow as the user's hand pivot in Ulnar (e.g. 30 degrees) and Radial (20 degrees) hand divination reducing carpal tunnel micro trauma and inflammation thereof. Also, by raising the position of the heel of the hand, the user's hand is elevated to a more neutral ergonomically sound position versus a 10-20 degrees wrist extension relative to the plane of the laptop's 24 keyboard. To achieve the proper positions of the hand, upper portion 32 is padded, such as with a memory foam, or is formed of a more sturdy material layer with proper ulnar, radial nerve positions carved into it, then with a top layer of padding. In an exemplary embodiment to treat CTS, the curved pad 32 has a thickness of from about 2 millimeters (mm) to about 4 mm for the thumb, forefinger position (e.g. radial nerve); and about 4 mm to about 6 mm for the pinkie finger (e.g. ulnar nerve). The elasticated portion 34 has a thickness of about 1 mm. As illustrated in FIGS. 1A, 1B, 2 and 4, another wrist pad 40 of the assemblage is sized and shaped for positioning on a mouse pad 42, the wrist pad 40 also serving to elevate the user's (right) hand to a more neutral ergonomically sound position versus wrist extension of about 10-30 degrees relative to the plane of the mouse pad. The main wrist pad 40 includes an interior cavity 43 within which small items, such as pens and pencils, may be stored. The cavity 43 may include a closure with a fastening means 44 well known in the art (e.g. a snap fit) to open and close the door 45.

As illustrated in FIGS. 1A, 1B, 5, 7, EMF or RF shielding is also provided by a cooperating pair of lap cushions 50 that are connected by a relatively short elasticated strap 52. The strap 52 serves to allow for some relative movement of the user's legs, as the cushions 52 are sized to rest upon the left and right legs, respectively. The cushions 50 are made of the same material as the wrist pads 20, 22 discussed above, and are relatively flexible for more secure positioning on the user's lap. The cushions 50 may alternatively be used as wrist wrests, providing a larger surface than wrist pads 20, 22. Cushions 50 are preferably used as wrist rests when the assemblage 10 is used with a desktop computer. And/or as illustrated in FIG. 2, lap cushions 50 can be used on a table-top to support a user's forearms, and the corner pads 20, 22 to support their wrists. Regarding FIG. 3, it can be seen that the assemblage 10 may also be used with a keyboard 60 associated with a desktop computer. In this deployment, lap cushions 50 are positioned in front of the keyboard 60 to serve as an ergonomic adjustment to affect hand position as mentioned above.

Figure 1A:
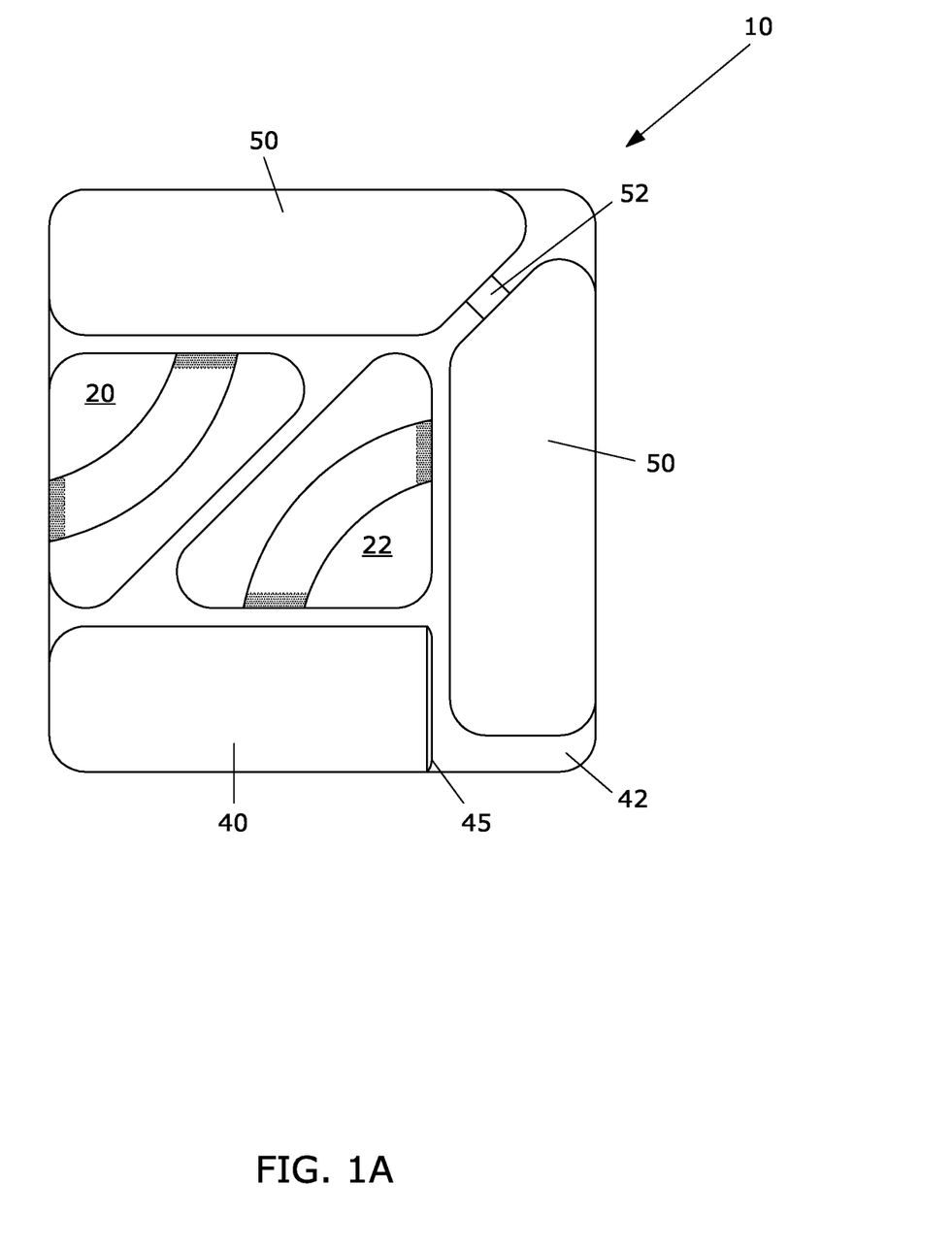
FIG. 1A is a top plan view of the assemblage of the present invention.
Figure 1B:
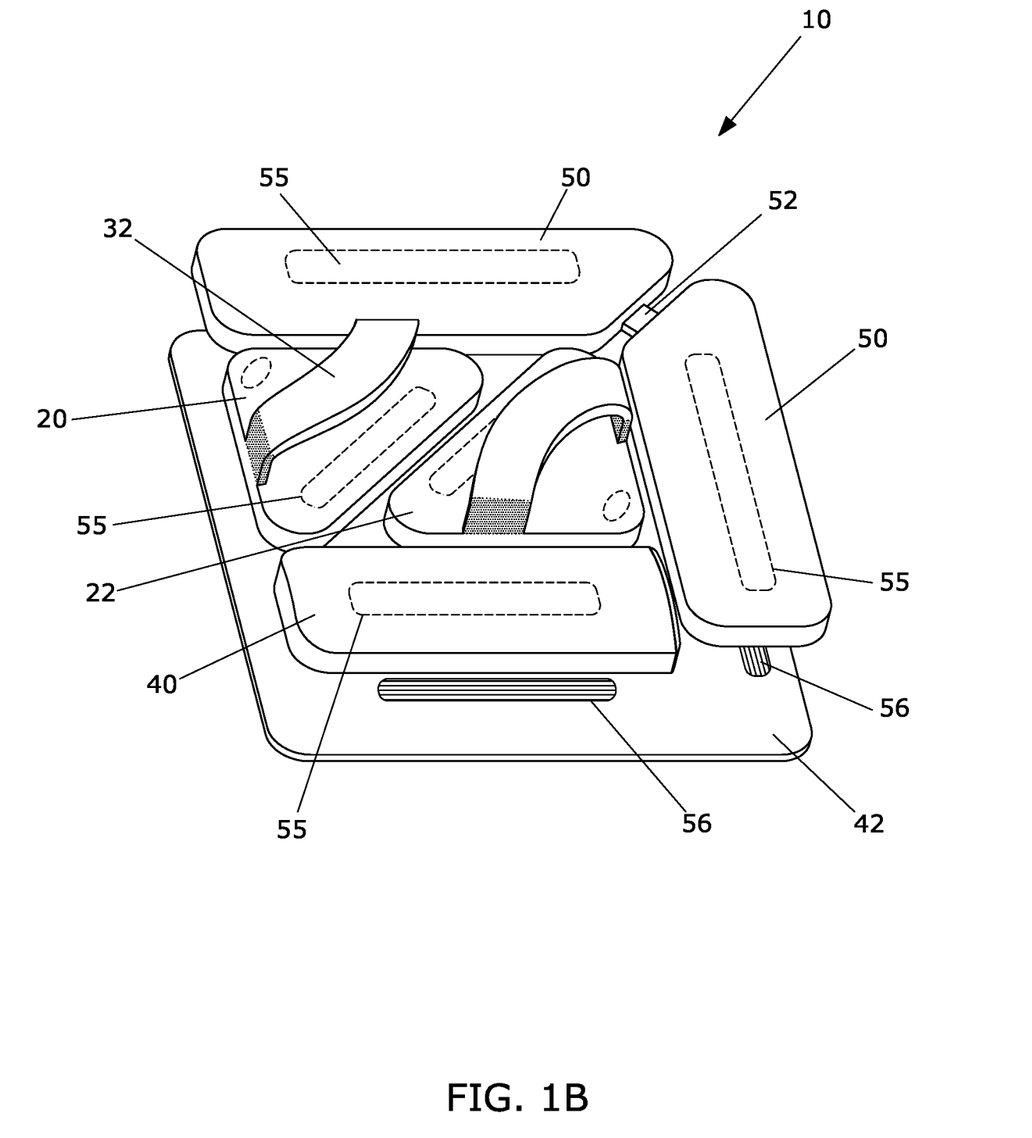
FIG. 1B is a top perspective view of the assemblage demonstrating how the pad components are configured on an underlying mouse pad; and how both the underside of the assemblage components and the underside of the mouse pad have aligned Velcro® strips to affix the assemblage in place of storage.

Storage: referring now particularly to FIGS. 1A and 1B, the assemblage 10 is shown in the storage mode on a mouse pad 42. It can be seen that assemblage 10 components 20, 22, 50, and 40 are sized and shaped to be positioned on the included mouse pad 42, the components geometrically shaped to be in non-overlapping relation with respect to each other, while being contained within the rectangular perimeter of the mouse pad 42. The components may be stored in a space saving manner such that the "footprint" of all of the components 20, 22, 40, 50 does not exceed the surface area of the mouse pad. The mouse pad 42 may be designed with Velcro® strips 56 (e.g. FIG. 1B, horizontal parallel lines) or other fastening means positioned on the mouse pad underside to hold the components 20, 22, 40, and 50 in relative position for compact storage and transport. The components 20, 22, 40, and 50 may further comprise matching, aligned Velcro strips 55 on the underside (e.g. FIG. 1B, dotted lines) to affix to the mouse pads Velcro® strips 55; or the surface material of components 20, 22, 40, and 50 allows for the mouse pads Velcro® strips 55 to attach and detach easily without damaging the material.

Alternatively, mouse pad 42 and components 20, 22, 40, and 50 may be stored in a box, bag or container without damaging them. It should be noted that a key aspect of the invention is that the components 20, 22, 40 and mouse pad 42 are shaped both for function and to be stored in a compact fashion.

Alternative Wrist Pads

Figure 8:
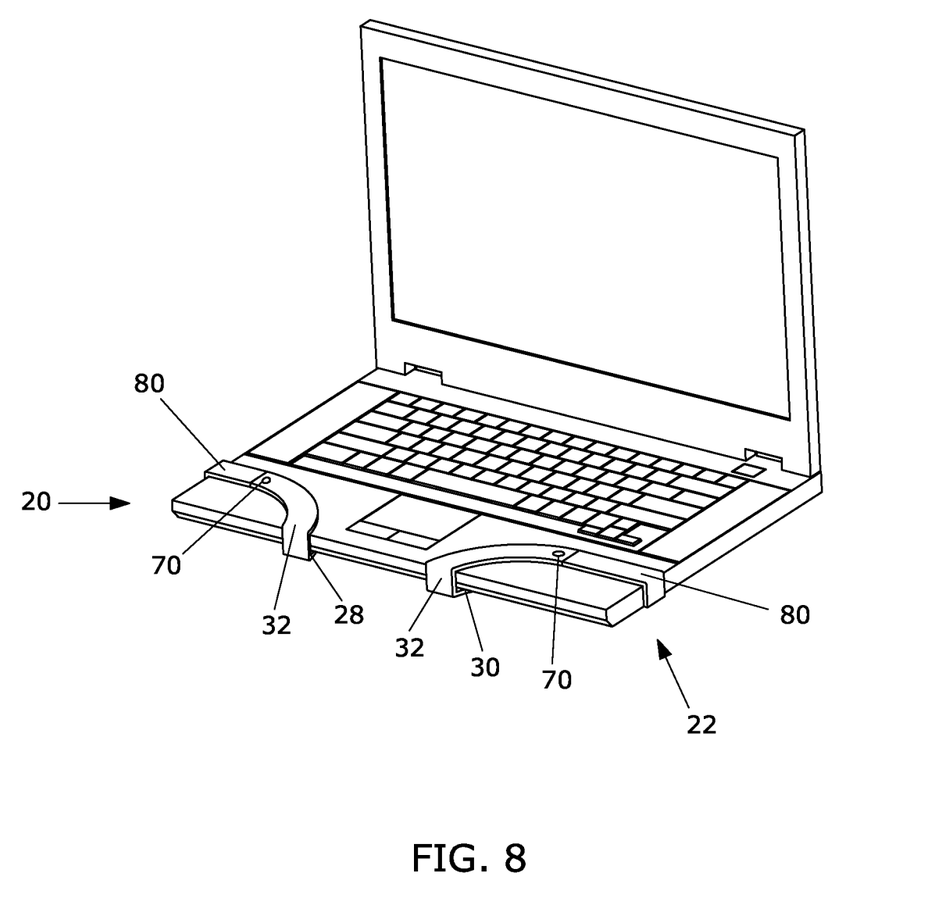
FIG. 8 is an illustration of one or both corners pads being detached at one end of the strap in order to affix the straps to the laptop surface in proper alignment with the typing keys, while (alternatively) using the triangular main bodies beneath the laptop.

A variety of alternative wrist pads are envisioned within the scope of the present invention to allow user adjusting the location of the pads to their comfort level and to properly align the keyboard components. As illustrated in FIG. 8, the right pad 22 or both pads 20, 22 are able to detach one end of the strap (e.g. the top) in order to affix the pad(s) to the laptop surface near the touch pad in alignment with the keys—e.g. right pad is aligned with the keys "J, K, L, etc.", and the left pad is aligned with the "F, D, E, A" keys. In an embodiment, the main body 28, 30 is still beneath the laptop, and 28, 30 have a thickness of about 1.0 mm to about 1.5 mm to not tilt the computer keyboard. Velcro® strips 55 may be positioned as part of the elastic portion 34 to detach and reattach the strip 32 to the base triangle (e.g. see FIGS. 6A, 6B).

An additional embodiment, extension strip 80 may be used to position the left and/or right strap near the middle of the keyboard, and it may connect to the main body 28, 30; or strip 80 may substitute in lieu of the main bodies (e.g. strip 80 encircles the underside of the laptop edges). Strip 80 is able to connect to cushion 32 by methods well known in the art: e.g. Velcro® strips 55, magnets 70, etc. . . . . .

Figure 9A:
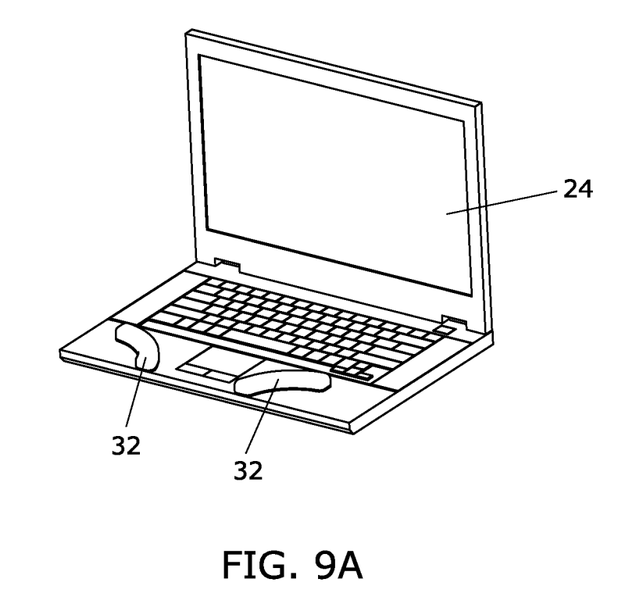
FIG. 9A is an illustration of an embodiment in which both straps are able to completely detach from their main base and be removable attached to the laptop surface beneath and in alignment with the proper keys for correct typing style.
Figure 9B:
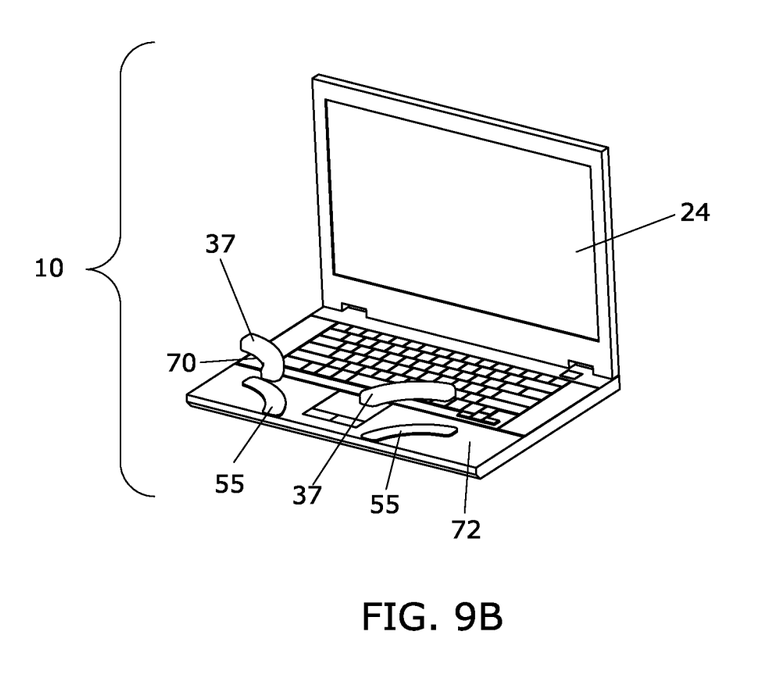
FIG. 9B is an exploded view of FIG. 9A showing the use of 2-way or sided Velcro® strips positioned between the straps and the laptop surface.
Figure 10:
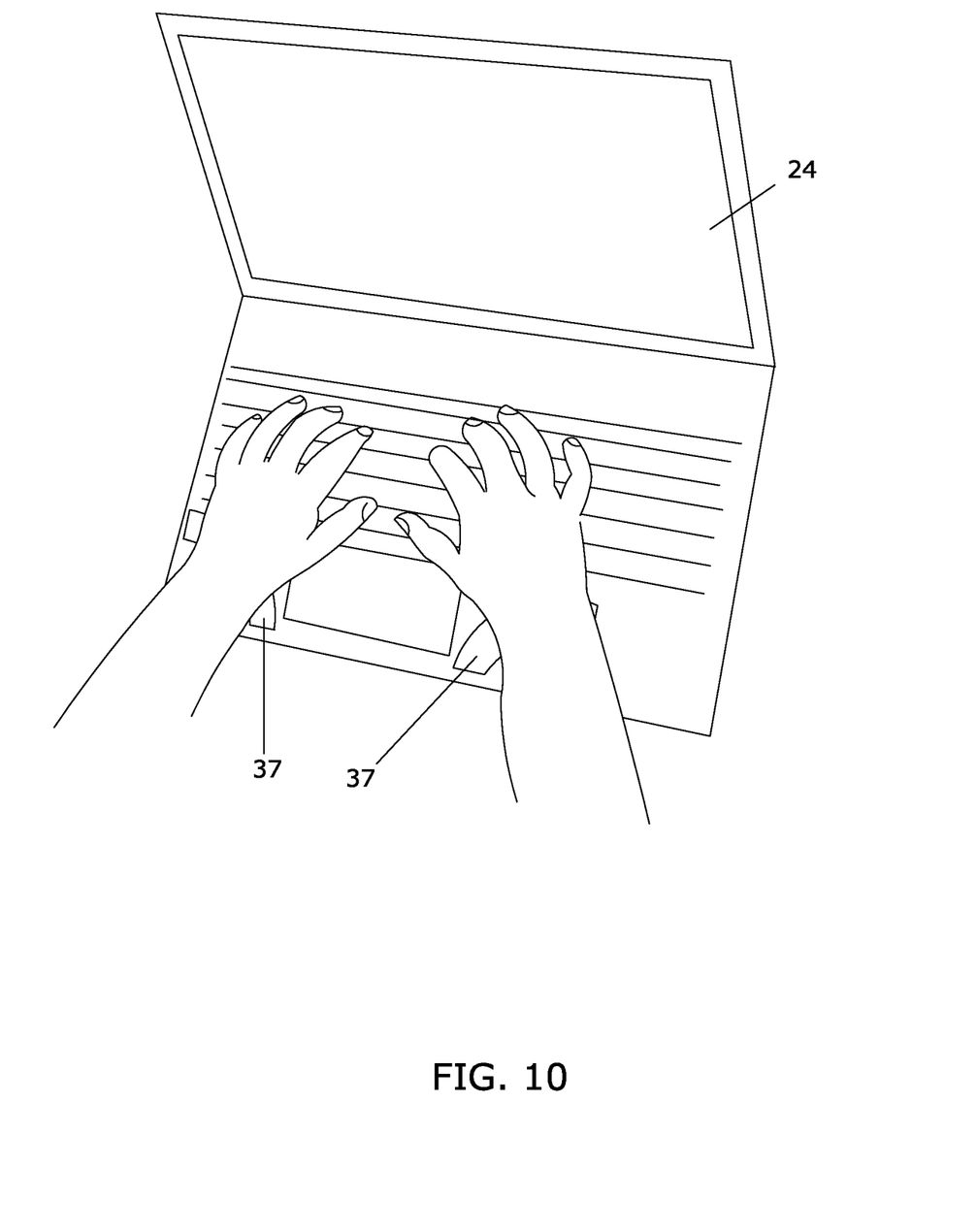
FIG. 10 illustrates how the moveable curved straps continue to provide prevention and/or alleviation from carpal tunnel syndrome (CTS) by allowing the user to move the straps to a position that they can comfortably rest their wrist's on while keeping their fingers in alignment with the proper typing keys.

In another embodiment, the wrist straps 32 comprise top cushions without components on the computer underside. For example, FIGS. 9A and 9B are perspective views of a laptop with upper portion curved straps 32 completely detached from a main body 28, 30 and affixed to the laptop surface using 2-way Velcro® strips 55 and/or magnets 70 positioned between the straps 32 and the laptop surface 72 (e.g. see exploded view FIG. 9B). FIG. 10 illustrates how the curved straps 32 continue to provide prevention and/or alleviation from carpal tunnel syndrome (CTS) by allowing the user to move the straps to a position that they can comfortably rest the palm of their wrist's on while keeping their fingers in alignment with the proper typing keys.

CONCLUSION

It will be appreciated that the methods and apparatus of the present disclosure can be incorporated in the form of a variety of embodiments, only a few of which are disclosed herein. It will also be apparent for the expert skilled in the field that other embodiments exist and do not depart from the spirit of the invention. Thus, the described embodiments are illustrative and should not be construed as restrictive.

Accordingly, the preceding exemplifications merely illustrate the principles of the various embodiments. It will be appreciated that those skilled in the art will be able to devise various arrangements which, although not explicitly described or shown herein, embody the principles of the embodiments and are included within its spirit and scope. Furthermore, all examples and conditional language recited herein are principally intended to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the various embodiments, therefore, is not intended to be limited to the exemplary embodiments shown and described herein.

The technology illustratively described herein suitably may be practiced in the absence of any element(s) not specifically disclosed herein. Thus, for example, in each instance herein any of the terms "comprising," "consisting essentially of," and "consisting of" may be replaced with either of the other two terms. The terms and expressions which have been employed are used as terms of description and not of limitation, and use of such terms and expressions do not exclude any equivalents of the features shown and described or portions thereof, and various modifications are possible within the scope of the technology claimed. The term "a" or "an" can refer to one of or a plurality of the elements it modifies (e.g., "a reagent" can mean one or more reagents) unless it is contextually clear either one of the elements or more than one of the elements is described.

The term "about" as used herein refers to a value within 10% of the underlying parameter (i.e., plus or minus 1, 2, 3, 4, 5, 6, 7, 8, 9, 10%; preferably 5%), and use of the term "about" at the beginning of a string of values modifies each of the values (i.e., "about 1, 2 and 3" refers to about 1, about 2 and about 3).

As used herein, the term "substantially" refers to approximately the same shape as stated, and recognizable by one of ordinary skill in the art.

Trademarks: the product names used in this document are for identification purposes only; and are the property of their respective owners.

What is claimed is:

1. An assemblage of components for providing improved ergonomic positioning and RF shielding for users of a laptop and a desktop computer, comprising:
   a. a first and a second wrist pad, said wrist pads configured for removable attachment to left and right front corners of a laptop, said wrist pads having a main body lower portion formed of RF shielding material and positioned on a laptop underside, and attached to an upper strap portion having an arcuate shape and positioned above the laptop front corners to accommodate pivoting of a user's hand;
   b. a pair of lap cushions formed of RF shielding material;
   c. a mouse pad upon which said assemblage components fit;
   d. an underside of said mouse pad having a plurality of fastening material to affix said assemblage components to a mouse pad underside for assembly storage;
   e. a third wrist pad substantially rectangular shaped for positioning on said mouse pad; and
   f. said third wrist pad comprising an interior cavity as storage space and with a closure.

2. The assemblage of claim 1, wherein said upper strap portion of said first and second wrist pads is attached to said main body lower portion by an elasticated connector.

3. The assemblage of claim 2, said elasticated connector further comprising a friction material on an exterior surface able to reduce slippage of the first and second wrist pads relative to the laptop regardless of the dimensions of the laptop.

4. The assemblage of claim 2, wherein said elasticated connectors further comprise a Velcro strip affixed on an end to detach and reattach the elasticated connectors to the main body lower portion.

5. The assemblage of claim 1, wherein the main body lower portion of said first and second wrist pads has a triangular shape corresponding to corners of said laptop.

6. The assemblage of claim 5, wherein the main body lower portion has a thickness of about 1.0 mm to about 1.5 mm.

7. The assemblage of claim 1, wherein the assemblage components are geometrically shaped for positioning on said mouse pad in non-overlapping relation with respect to said mouse pad when said assemblage is in a storage mode.

8. The assemblage of claim 1, wherein the assemblage components comprise fastening material on an underside side for attachment to said mouse pad underside when said assemblage is in the storage mode.

9. The assemblage of claim 1, wherein the RF material in the lap pads is made of flexible material for secure positioning on a lap or as a fourth wrist pad or a forearm pads with a table-top computer.

10. The assemblage of claim 1, wherein the first and second wrist pads upper strap portion have an arcuate shape and stiffness able to position a user's wrist and/or heel of hand atop the wrist pads and in a proper ulnar, radial nerve positions to prevent and/or alleviate symptoms for carpal tunnel syndrome (CTS) when the user positions.

11. The assemblage of claim 10, wherein the first and second wrist pads have a thickness of about 2 mm to about 4 mm for the radial nerve in a user's thumb, forefinger; and about 5 mm to about 8 mm for the ulnar nerve in the user's pinkie finger.

12. The assemblage of claim 2, wherein the elasticated connector has a thickness of about 1 mm.

13. The assemblage of claim 1, wherein said lap cushions are connected by an elasticated strap.

14. The assemblage of claim 1, wherein the wrist pad upper strap portions are detached from the main bodies; and the wrist pad upper strap portions are able to attach to or near a computer keyboard.

15. The assemblage of claim 14, wherein the wrist pad upper strap portion further comprises an extension strip to securely attach said upper strap portions to the sides of a computer keyboard.

16. The assemblage of claim 14, further comprising 2-way Velcro strips and/or magnets positioned between the wrist pad upper portions and a laptop surface to attach to the computer keyboard.

* * * * *